United States Patent
Kim

(10) Patent No.: US 11,830,572 B2
(45) Date of Patent: Nov. 28, 2023

(54) PIPE LATCH CIRCUIT, OPERATING METHOD THEREOF, AND SEMICONDUCTOR MEMORY DEVICE INCLUDING THE SAME

(71) Applicant: SK hynix Inc., Icheon-si (KR)

(72) Inventor: Bo Kyeom Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 51 days.

(21) Appl. No.: 17/242,639

(22) Filed: Apr. 28, 2021

(65) Prior Publication Data

US 2022/0189516 A1  Jun. 16, 2022

(30) Foreign Application Priority Data

Dec. 15, 2020 (KR) .......................... 10-2020-0175196

(51) Int. Cl.
*G11C 7/10* (2006.01)
*G11C 7/22* (2006.01)

(52) U.S. Cl.
CPC ............ *G11C 7/106* (2013.01); *G11C 7/1093* (2013.01); *G11C 7/222* (2013.01)

(58) Field of Classification Search
CPC ................................ G11C 7/106; G11C 7/10
USPC .................................................... 365/189.05
See application file for complete search history.

(56) References Cited

U.S. PATENT DOCUMENTS

| | | | | |
|---|---|---|---|---|
| 6,310,816 B2* | 10/2001 | Manning | ................. | G11C 8/08 |
| | | | | 365/230.03 |
| 2004/0240302 A1* | 12/2004 | Park | ..................... | G11C 7/1042 |
| | | | | 365/189.08 |
| 2007/0070676 A1* | 3/2007 | Kim | ..................... | G11C 11/4076 |
| | | | | 365/189.05 |
| 2007/0070713 A1* | 3/2007 | Lee | ..................... | G11C 11/4072 |
| | | | | 365/189.05 |
| 2011/0188324 A1* | 8/2011 | Kim | ......................... | G11C 7/10 |
| | | | | 365/230.03 |
| 2014/0347939 A1* | 11/2014 | Lim | ..................... | G11C 7/1063 |
| | | | | 365/191 |
| 2015/0302915 A1* | 10/2015 | Park | .......................... | G11C 7/10 |
| | | | | 365/189.05 |
| 2019/0325925 A1* | 10/2019 | Kim | ..................... | G11C 11/4076 |
| 2020/0098404 A1* | 3/2020 | Kim | ..................... | G11C 11/4076 |

FOREIGN PATENT DOCUMENTS

| | | | |
|---|---|---|---|
| KR | 1020180131861 A | | 12/2018 |
| KR | 101987304 B1 | | 6/2019 |

* cited by examiner

*Primary Examiner* — Muna A Techane
(74) *Attorney, Agent, or Firm* — WILLIAM PARK & ASSOCIATES LTD.

(57) ABSTRACT

A pipe latch circuit may include first and second latching circuit groups. The first latching circuit group may control a latching operation and an output operation based on a plurality of pipe input control signals. The second latching circuit group may control a latching operation and an output operation based on the plurality of pipe input control signals and a plurality of pipe output control signals.

13 Claims, 6 Drawing Sheets

PIPE LATCH CIRCUIT, OPERATING METHOD THEREOF, AND SEMICONDUCTOR MEMORY DEVICE INCLUDING THE SAME

CROSS-REFERENCE TO RELATED APPLICATION

The present application claims priority under 35 U.S.C. § 119(a) to Korean application number 10-2020-0175196, filed on Dec. 15, 2020, in the Korean Intellectual Property Office, which is incorporated herein by reference in its entirety.

BACKGROUND

1. Field

Exemplary embodiments relate to a pipe latch circuit, an operating method thereof, and a semiconductor memory device including the same, and particularly, to a pipe latch circuit capable of performing a pipe latching operation based on a pipe input control signal and a pipe output control signal, an operating method thereof, and a semiconductor memory device including the same.

2. Discussion of the Related Art

In general, a semiconductor memory device receives and stores data and outputs stored data. At the present time, a semiconductor memory device is designed to process a large amount of data. The semiconductor memory device may include a pipe latch circuit in order to efficiently process a large amount of data.

FIG. 1 is a block diagram for illustrating a configuration of the existing pipe latch circuit 10.

Referring to FIG. 1, the pipe latch circuit 10 includes first to eighth latching circuits 11, 12, 13, 14, 15, 16, 17, and 18.

Each of the first to eighth latching circuits 11, 12, 13, 14, 15, 16, 17, and 18 receives input data DAT_IN and outputs the input data DAT_IN as output data DAT_OUT. First, the first latching circuit 11 latches the input data DAT_IN based on a first pipe input control signal PIN<1>, and outputs latched data as the output data DAT_OUT based on a first pipe output control signal POUT<1>. Each of the second to eighth latching circuits 12, 13, 14, 15, 16, 17, and 18 also operates in a similar manner to the first latching circuit 11. In other words, the second to eighth latching circuits 12, 13, 14, 15, 16, 17, and 18 latch the input data DAT_IN based on second to eighth pipe input control signals PIN<2:8>, respectively, and output latched data as the output data DAT_OUT based on second to eighth pipe output control signals POUT<2:8>, respectively.

In this case, the input data DAT_IN include eight data that are consecutively input. Next, the first to eighth pipe input control signals PIN<1:8> are signals sequentially enabled after the first pipe input control signal PIN<1> is enabled. Furthermore, the first to eighth pipe output control signals POUT<1:8> are signals sequentially enabled after the first pipe output control signal POUT<1> is enabled. Accordingly, the first to eighth latching circuits 11, 12, 13, 14, 15, 16, 17, and 18 sequentially latch the input data DAT_IN based on the first to eighth pipe input control signals PIN<1:8>, respectively. Furthermore, the first to eighth latching circuits 11, 12, 13, 14, 15, 16, 17, and 18 sequentially output latched data based on the first to eighth pipe output control signals POUT<1:8>, respectively. That is, the pipe latch circuit 10 latches the eight input data DAT_IN and outputs the latched eight input data DAT_IN as the output data DAT_OUT.

As may be seen from FIG. 1, the existing pipe latch circuit requires the eight first to eighth pipe input control signals PIN<1:8> and the eight first to eighth pipe output control signals POUT<1:8>.

At the present time, a semiconductor memory device is designed to process a large amount of data. Accordingly, the number of first to eighth latching circuits 11, 12, 13, 14, 15, 16, 17, and 18 included in the pipe latch circuit 10 is gradually increasing. An increase in the number of first to eighth latching circuits 11, 12, 13, 14, 15, 16, 17, and 18 means that the number of first to eighth pipe input control signals PIN<1:8> for controlling the first to eighth latching circuits 11, 12, 13, 14, 15, 16, 17, and 18 and the number of first to eighth pipe out control signals POUT<1:8> are also increasing.

In this case, an increase in the number of first to eighth pipe input control signals PIN<1:8> and the number of first to eighth pipe output control signals POUT<1:8> act as factors to increase a circuit area occupied by the pipe latch circuit 10. Furthermore, an increase in the number of first to eighth pipe input control signals PIN<1:8> and the number of first to eighth pipe output control signals POUT<1:8> causes noise attributable to interference between signals. If noise occurs in the first to eighth pipe input control signals PIN<1:8> and the first to eighth pipe output control signals POUT<1:8>, a normal pipe latching operation of the pipe latch circuit may not be guaranteed.

SUMMARY

In an embodiment, a pipe latch circuit may include a first latching circuit group suitable for controlling a latching operation and an output operation for input data based on a plurality of pipe input control signals and a second latching circuit group suitable for controlling a latching operation for data, output by the first latching circuit group, based on the plurality of pipe input control signals and controlling an output operation based on a plurality of pipe output control signals.

In an embodiment, an operating method of a pipe latch circuit may include a first pipe latching operation step of performing a latching operation and an output operation on input data based on a plurality of pipe input control signals, a second pipe latching operation step of performing a latching operation on data that may be output in the first pipe latching operation step, based on the plurality of pipe input control signals and performing an output operation for latched data based on a plurality of pipe output control signals, and a third pipe latching operation step of performing a latching operation and an output operation by repeating the first pipe latching operation step and the second pipe latching operation step.

In an embodiment, a semiconductor memory device may include a first latching circuit group disposed within a core region and a second latching circuit group disposed within a peri region. The first latching circuit group may be disposed within a core region and may be suitable for controlling a latching operation and an output operation for input data based on a plurality of pipe input control signals. The second latching circuit group may be disposed within a peri region and may be suitable for controlling a latching operation for data that may be output by the first latching circuit group, based on the plurality of pipe input control signals and controlling an output operation based on a plurality of pipe output control signals.

DETAILED DESCRIPTION

Figure 1:
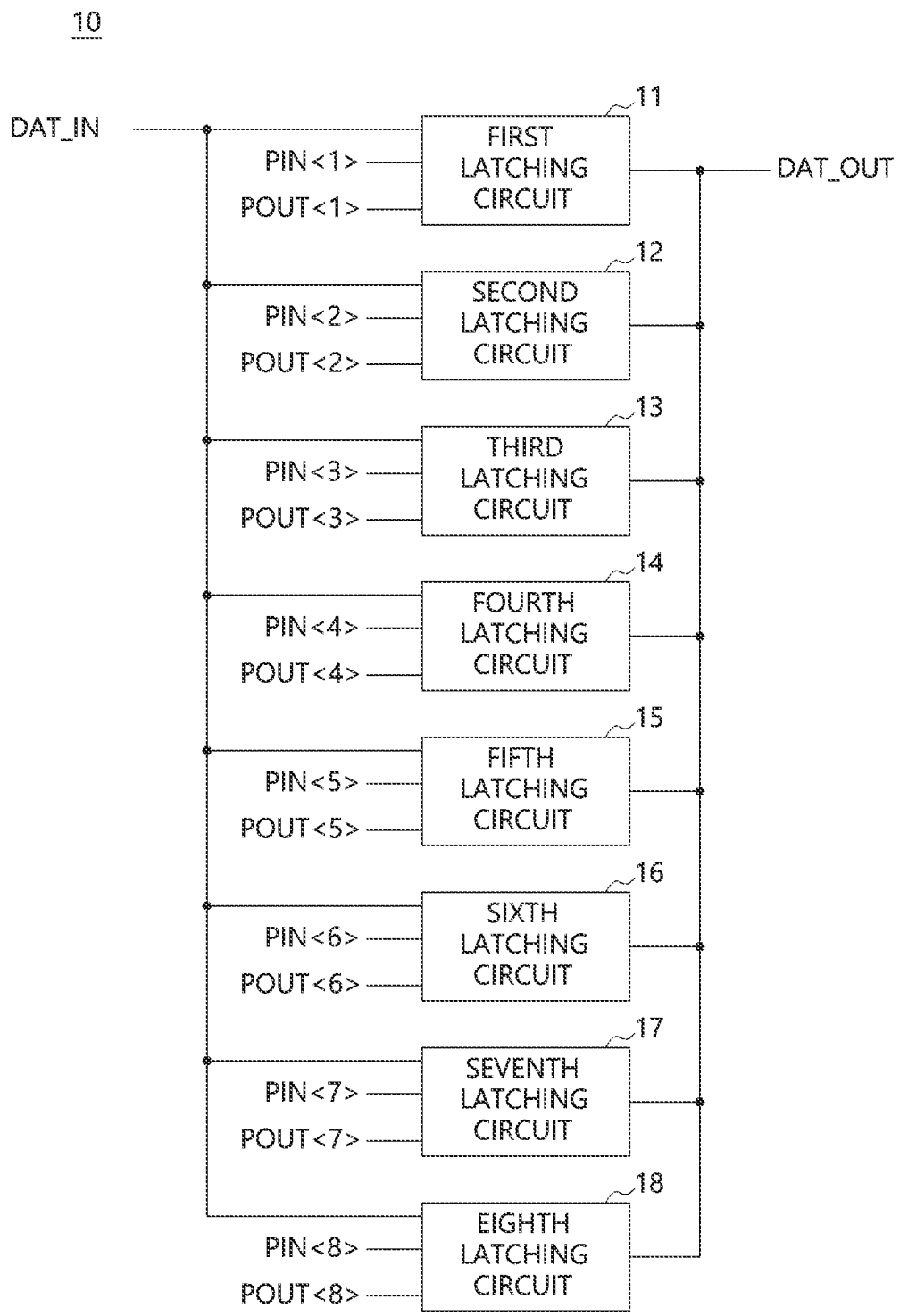
FIG. 1 is a block diagram for illustrating a configuration of the existing pipe latch circuit.

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of steps, symbols (e.g., a, b, and c) are used for convenience of description, and the symbols do not describe an order of the steps. The steps may be performed in an order different from the order described in the context unless a specific order is clearly described in the context. That is, the steps may be performed according to a described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

Various embodiments are directed to providing a pipe latch circuit capable of minimizing the number of control signals used for the pipe latch circuit and performing a pipe latching operation, and an operating method thereof.

Also, various embodiments are directed to providing a semiconductor memory device capable of minimizing the number of data transmission lines coupled between latching circuit groups included in a pipe latch circuit and performing a pipe latching operation.

Figure 2:
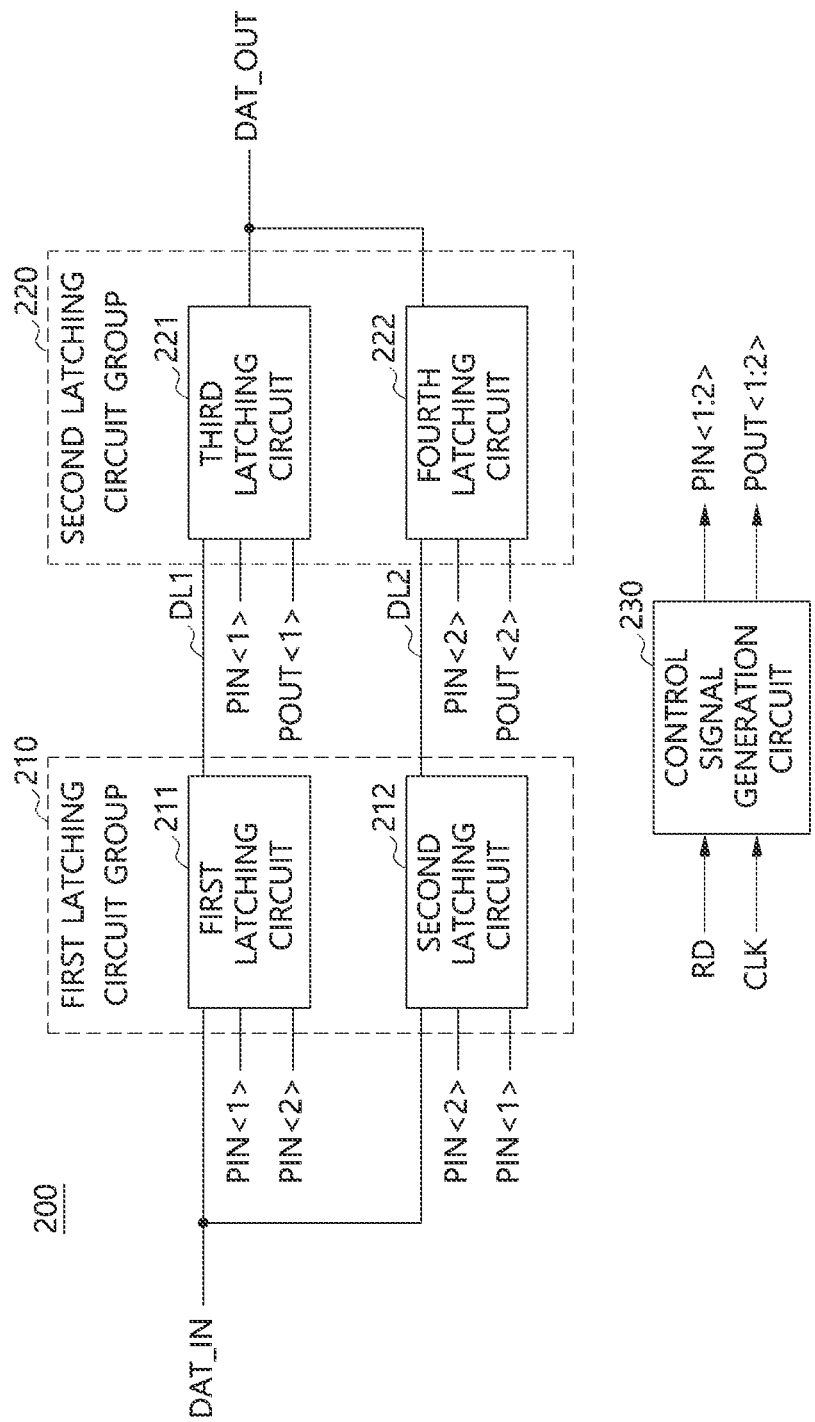
FIG. 2 is a block diagram for illustrating a configuration of a pipe latch circuit according to an embodiment of the present disclosure.

FIG. 2 is a block diagram for illustrating a configuration of a pipe latch circuit 200 according to an embodiment of the present disclosure.

Referring to FIG. 2, the pipe latch circuit 200 may include a first latching circuit group 210 and a second latching circuit group 220.

First, based on a plurality of pipe input control signals, the first latching circuit group 210 may be an element for controlling a latching operation and an output operation for input data DAT_IN. In other words, based on first and second pipe input control signals PIN<1:2>, the first latching circuit group 210 may control the latching operation for the input data DAT_IN. Furthermore, based on the first and second pipe input control signals PIN<1:2>, the first latching circuit group 210 may control the output operation for latched data.

The first latching circuit group 210 is more specifically described. The first latching circuit group 210 may include a first latching circuit 211 and a second latching circuit 212.

Based on the first pipe input control signal PIN<1>, the first latching circuit 211 may be an element for latching the input data DAT_IN. Furthermore, based on the second pipe input control signal PIN<2>, the first latching circuit 211 may be an element for outputting latched data. The output data of the first latching circuit 211 may be output through a first data transmission line DL1.

Based on the second pipe input control signal PIN<2>, the second latching circuit 212 may be an element for latching the input data DAT_IN. Furthermore, based on the first pipe input control signal PIN<1>, the second latching circuit 212 may be an element for outputting latched data. The output data of the second latching circuit 212 may be output through a second data transmission line DL2.

Next, based on a plurality of pipe input control signals, the second latching circuit group 220 may be an element for controlling a latching operation for data that is output by the first latching circuit group 210. Furthermore, based on a plurality of pipe output control signals, the second latching circuit 220 may be an element for controlling an output operation. In other words, based on first and second pipe input control signals PIN<1:2>, the second latching circuit group 220 may control the latching operation for the data, output by the first latching circuit group 210. Furthermore, based on first and second pipe output control signals POUT<1:2>, the second latching circuit group 220 may control the output operation for latched data.

The second latching circuit group 220 is more specifically described. The second latching circuit group 220 may include a third latching circuit 221 and a fourth latching circuit 222.

Based on the first pipe input control signal PIN<1>, the third latching circuit 221 may be an element for latching output data of the first latching circuit 211. Furthermore, based on the first pipe output control signal POUT<1>, the third latching circuit 221 may be an element for outputting latched data as output data DAT_OUT.

The fourth latching circuit 222 may be an element for receiving and latching output data of the second latching circuit 212 based on the second pipe input control signal PIN<2>. Furthermore, based on the second pipe output control signal POUT<2>, the fourth latching circuit 222 may be an element for outputting latched data as the output data DAT_OUT.

The pipe latch circuit 200 according to an embodiment of the present disclosure may include the first and second latching circuit groups 210 and 220. In this case, based on the first and second pipe input control signals PIN<1:2>, the first latching circuit group 210 may perform a latching operation and an output operation for the input data DAT_IN. Furthermore, based on the first and second pipe input control signals PIN<1:2> and the first and second pipe output control signals POUT<1:2>, the second latching circuit group 220 may perform a latching operation and an output operation for data, output by the first latching circuit group 210.

The pipe latch circuit 200 may include a control signal generation circuit 230.

The control signal generation circuit 230 may be an element for generating a plurality of pipe input control signals and a plurality of pipe output control signals upon read operation.

First, the plurality of pipe input control signals may include the first pipe input control signal PIN<1> to control latching operations of the first and third latching circuits 211 and 221 and an output operation of the second latching circuit 212. Furthermore, the pipe input control signals may include the second pipe input control signal PIN<2> to control latching operations of the second and fourth latching circuits 212 and 222 and an output operation of the first latching circuit 211. Next, the pipe output control signals may include the first pipe output control signal POUT<1> to control an output operation of the third latching circuit 221 and the second pipe output control signal POUT<2> to control an output operation of the fourth latching circuit 222.

Next, the number of pipe input control signals may correspond to the number of latching circuits included in the first latching circuit group 210. In other words, the two first and second pipe input control signals PIN<1:2> may correspond to the two first and second latching circuits 211 and 212 included in the first latching circuit group 210. Furthermore, the number of pipe output control signals may correspond to the number of latching circuits included in the second latching circuit group 220. In other words, the two first and second pipe output control signals POUT<1:2> may correspond to the two third and fourth latching circuits 221 and 222 included in the second latching circuit group 220.

Based on a read command signal RD and a data strobe clock signal CLK, the control signal generation circuit 230 may generate the first and second pipe input control signals PIN<1:2> and the first and second pipe output control signals POUT<1:2>.

In this case, the read command signal RD may be a signal enabled upon read operation. Furthermore, the data strobe clock signal CLK may be a signal used for the synchronization of the input data DAT_IN and the first and second pipe input control signals PIN<1:2>. Furthermore, the data strobe clock signal CLK may be a signal used for the synchronization of the output data DAT_OUT and the first and second pipe output control signals POUT<1:2>. More specifically, based on the data strobe clock signal CLK, the control signal generation circuit 230 may generate the first and second pipe input control signals PIN<1:2> and the first and second pipe output control signals POUT<1:2>. Accordingly, based on the first and second pipe input control signals PIN<1:2> synchronized with the data strobe clock signal CLK, the first latching circuit group 210 may perform a latching operation and an output operation. Furthermore, the second latching circuit group 220 may perform a latching operation and an output operation based on the first and second pipe input control signals PIN<1:2> and the first and second pipe output control signals POUT<1:2> synchronized with the data strobe clock signal CLK.

Hereinafter, a pipe latching operation of the pipe latch circuit 200 of FIG. 2 is described in brief. Prior to the description, upon read operation, the input data DAT_IN including a plurality of data may be input to the first latching circuit group 210. Hereinafter, it is assumed that the input data DAT_IN include four data, for convenience of description.

First, based on the read command signal RD and the data strobe clock signal CLK, the control signal generation circuit 230 may generate the first and second pipe input control signals PIN<1:2> and the first and second pipe output control signals POUT<1:2> that are sequentially enabled.

Based on the first pipe input control signal PIN<1>, the first latching circuit 211 may latch a first data of the input data DAT_IN. Furthermore, based on the second pipe input control signal PIN<2>, the second latching circuit 212 may latch a second data of the input data DAT_IN. At this time, based on the second pipe input control signal PIN<2>, the first latching circuit 211 may output the latched first data. Furthermore, based on the first pipe input control signal PIN<1>, the second latching circuit 212 may output the latched second data. Hereinafter, a latching operation and an output operation for the input data DAT_IN performed in the first latching circuit group 210 is defined as a "first pipe latching operation", for convenience of description.

Next, based on the first pipe input control signal PIN<1>, the third latching circuit 221 may latch the first data, output by the first latching circuit 211. Furthermore, based on the second pipe input control signal PIN<2>, the fourth latching circuit 222 may latch the second data, output by the second latching circuit 212. Thereafter, based on the first pipe output control signal POUT<1>, the third latching circuit 221 may output latched data as the output data DAT_OUT. Furthermore, based on the second pipe output control signal POUT<2>, the fourth latching circuit 222 may output latched data as the output data DAT_OUT. That is, based on the first and second pipe output control signals POUT<1:2>, respectively, the first data and the second data latched in the third and fourth latching circuits 221 and 222, respectively, may be sequentially output. Hereinafter, a latching operation and an output operation for the output data of the first latching circuit group 210 performed in the second latching circuit group 220 is defined as a "second pipe latching operation", for convenience of description.

Next, the aforementioned first and second pipe latching operations may be repeated, which is defined as a "third pipe latching operation." The pipe latch circuit 200 may output third and fourth data of the input data DAT_IN as the output data DAT_OUT through the third pipe latching operation.

As described above, based on the first pipe input control signal PIN<1>, the first latching circuit 211, the second latching circuit 212, and the third latching circuit 221 may perform operations. That is, the latching operations of the first and third latching circuits 211 and 221 and the output operation of the second latching circuit 212 may be simultaneously performed. Furthermore, based on the second pipe input control signal PIN<2>, the first latching circuit 211, the second latching circuit 212, and the fourth latching circuit 222 may perform operations. That is, the latching operations of the second and fourth latching circuits 212 and 222 and the output operation of the first latching circuit 211 may be simultaneously performed.

The pipe latch circuit 200 according to an embodiment of the present disclosure may include the first latching circuit group 210 and the second latching circuit group 220. Furthermore, based on the first and second pipe input control signals PIN<1:2>, upon first pipe latching operation, the pipe latch circuit 200 may control a latching operation and an output operation for the first latching circuit group 210. Furthermore, based on the first and second pipe input control signals PIN<1:2> and the first and second pipe output control signals POUT<1:2>, upon second pipe latching operation, the pipe latch circuit 200 may control a latching operation and an output operation for the second latching circuit group 220. Furthermore, the pipe latch circuit 200 may perform the third pipe latching operation, and may output the first, second, third, and fourth data, included in the input data DAT_IN, as the output data DAT_OUT through the first to third pipe latching operations.

In FIG. 2, a case where the first latching circuit group 210 and the second latching circuit group 220 are coupled in series is described as an example. In this case, each of the first latching circuit group 210 and the second latching circuit group 220 may be defined as a "unit latching circuit group" including a plurality of latching circuits. That is, a pipe latch circuit according to an embodiment of the present disclosure may include at least two unit latching circuit groups coupled in series. In this case, the second latching circuit group 220, that is, the last unit latching circuit group from which the output data DAT_OUT is generated may perform the second pipe latching operation. Furthermore, the first latching circuit group 210, that is, at least one unit latching circuit group coupled to a previous stage of the last unit latching circuit group, may perform the first pipe latching operation.

The pipe latch circuit 200 according to an embodiment of the present disclosure may include a plurality of unit latching circuit groups, and may generate the output data DAT_OUT through a pipe latching operation for the input data DAT_IN.

Figure 3:
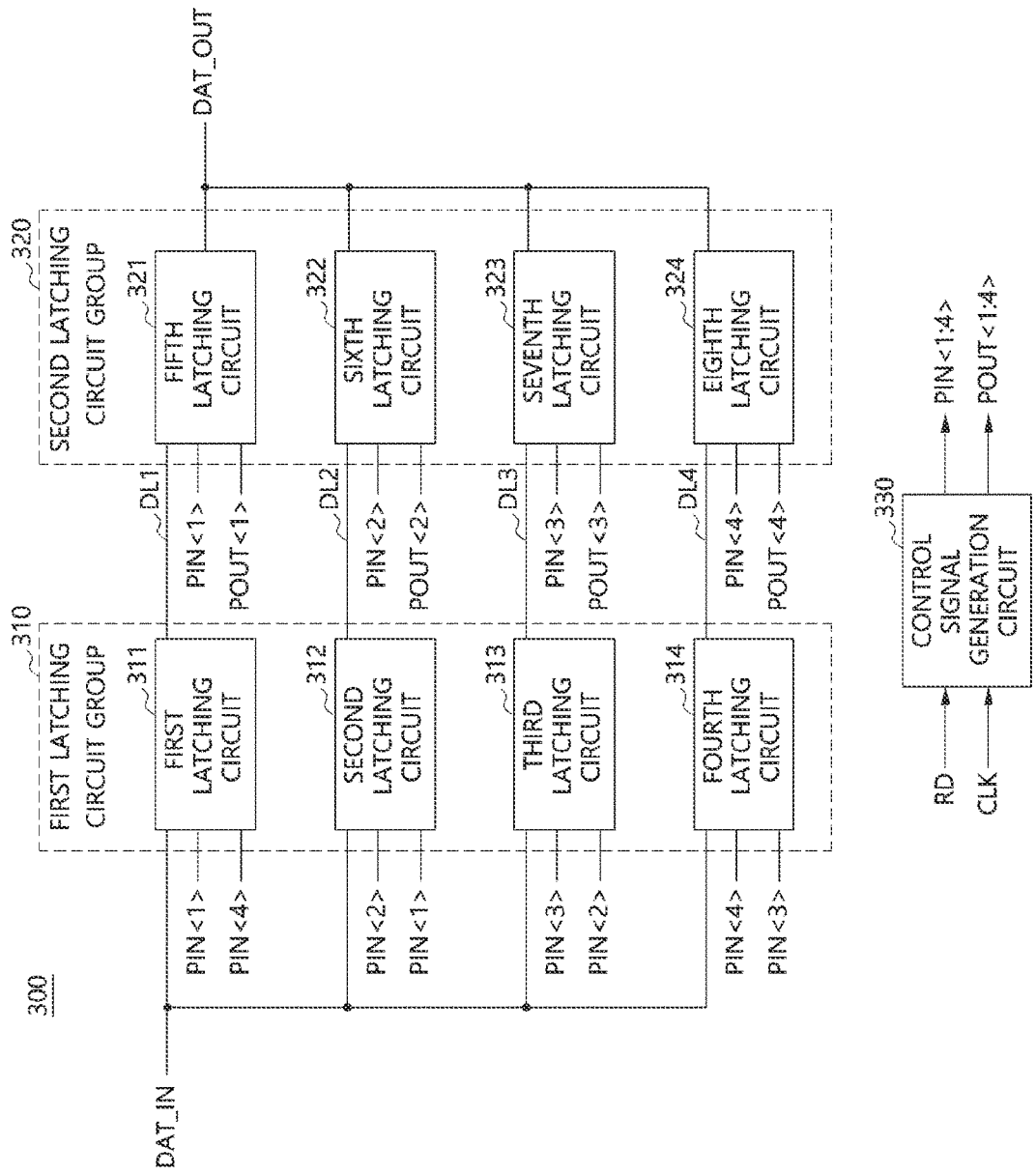
FIG. 3 is a block diagram for illustrating a configuration of a pipe latch circuit according to another embodiment of the present disclosure.

FIG. 3 is a block diagram for illustrating a configuration of a pipe latch circuit 300 according to an embodiment of the present disclosure.

Referring to FIG. 3, the pipe latch circuit 300 may include a first latching circuit group 310, a second latching circuit group 320, and a control signal generation circuit 330. In this case, the first latching circuit group 310, the second latching circuit group 320, and the control signal generation circuit 330 may correspond to the first latching circuit group 210, the second latching circuit group 220, and the control signal generation circuit 230 of FIG. 2, respectively. Accordingly, a detailed description of the configuration and operation of each of the first latching circuit group 310, the second latching circuit group 320, and the control signal generation circuit 330 is omitted.

In the pipe latch circuit 300 of FIG. 3, the number of latching circuits included in the first latching circuit group 310 and the number of latching circuits included in the second latching circuit group 320 may be different from those of the pipe latch circuit 200 of FIG. 2. That is, the first latching circuit group 310 may include four first to fourth latching circuits 311, 312, 313, and 314. The second latching circuit group 320 may include four fifth to eighth latching circuits 321, 322, 323, and 324. Accordingly, the control signal generation circuit 330 may generate four first to fourth pipe input control signals PIN<1:4> corresponding to the four latching circuits included in the first latching circuit group 310. Furthermore, corresponding to the four latching circuits included in the second latching circuit group 320, the control signal generation circuit 330 may generate four first to fourth pipe output control signals POUT<1:4>.

Through such a configuration, based on the first to fourth pipe input control signals PIN<1:4>, the pipe latch circuit 300 may control a latching operation and an output operation for the first latching circuit group 310. In this case, output data of the first to fourth latching circuits 311, 312, 313, and 134 may be transferred to the fifth to eighth latching circuits 321, 322, 323, and 324 through first to fourth data transmission lines DL1, DL2, DL3, and DL4, respectively. Furthermore, based on the first to fourth pipe input control signals PIN<1:4> and the first to fourth pipe output control signals POUT<1:4>, the pipe latch circuit 300 may control a latching operation and an output operation for the second latching circuit group 320. That is, eight input data DAT_IN may be output as output data DAT_OUT.

Hereinafter, the pipe latch circuit 300 of FIG. 3 and the pipe latch circuit 10 of FIG. 1 are compared and described.

Each of the pipe latch circuit 10 of FIG. 1 and the pipe latch circuit 300 of FIG. 3 may include the eight latching circuits for a pipe latching operation for the eight input data DAT_IN. In this case, the pipe latch circuit 10 of FIG. 1 includes the eight first to eighth pipe input control signals PIN<1:8> and the eight first to eighth pipe output control signals POUT<1:8> for the pipe latching operation. In contrast, the pipe latch circuit 300 of FIG. 3 according to an embodiment of the present disclosure may include the four first to fourth pipe input control signals PIN<1:4> and the four first to fourth pipe output control signals POUT<1:4>.

That is, the pipe latch circuit 300 of FIG. 3 may use only half the pipe input control signals and also use only half the pipe output control signals, compared to the pipe latch circuit 10 of FIG. 1. To use only half the pipe input control signals and only half the pipe output control signals may mean that the circuit area of the control signal generation circuit 330 that generates the first to fourth pipe input control signals PIN<1:4> and the first to fourth pipe output control signals POUT<1:4> may be reduced that much.

Accordingly, by minimizing the number of control signals and the circuit area of the control signal generation circuit 330, the pipe latch circuit 300 according to an embodiment of the present disclosure may minimize an area occupied by the pipe latch circuit 300. Furthermore, by reducing the number of control signals, the pipe latch circuit 300 may minimize noise, occurring in each of the control signals.

Figure 4:
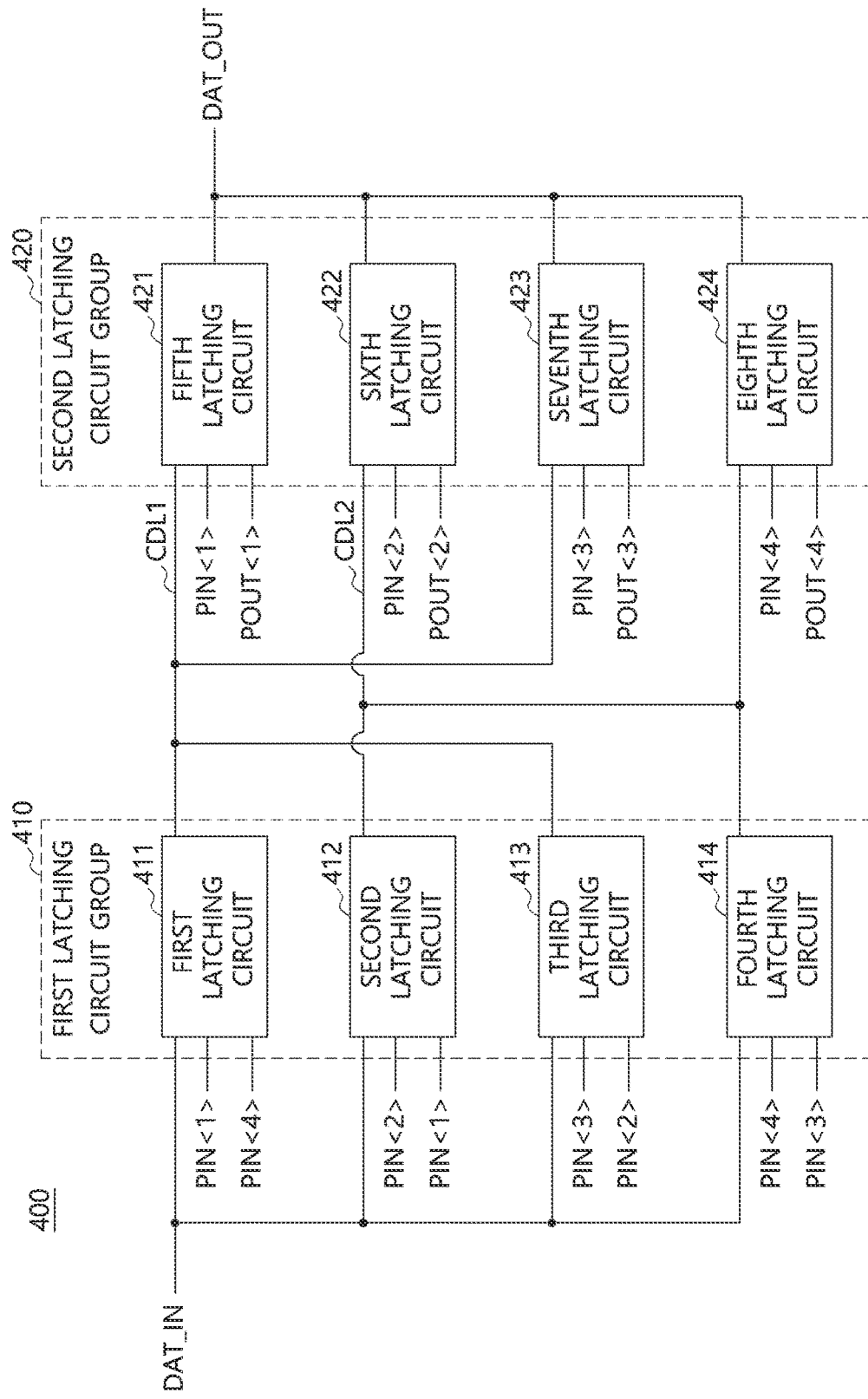
FIG. 4 is a block diagram for illustrating a configuration of a pipe latch circuit according to yet another embodiment of the present disclosure.

FIG. 4 is a block diagram for illustrating a configuration of a pipe latch circuit 400 according to an embodiment of the present disclosure. FIG. 4 illustrates a configuration similar to that of FIG. 3, and an element corresponding to the control signal generation circuit 330 of FIG. 3 is omitted.

Referring to FIG. 4, each of first and second latching circuit groups 410 and 420 may include at least three latching circuits. That is, the first latching circuit group 410 may include first to fourth latching circuits 411, 412, 413, and 414. The second latching circuit group 420 may include fifth to eighth latching circuits 421, 422, 423, and 424. The first latching circuit group 410 and the second latching circuit group 420 may be coupled by at least one common data transmission line. That is, the first latching circuit group 410 and the second latching circuit group 420 may include a first common data transmission line CDL1 and a second common data transmission line CDL2. FIG. 4 illustrates an example in which the two common data transmission lines are coupled to the latching circuit groups.

More specifically, the first and third latching circuits 411 and 413 and the fifth and seventh latching circuits 421 and 423 may be coupled by the first common data transmission line CDL1. Furthermore, the second and fourth latching circuits 412 and 414 and the sixth and eighth latching circuits 422 and 424 may be coupled by the second common data transmission line CDL2. Accordingly, output data of the first latching circuit 411 may be transferred through the first common data transmission line CDL1 to the fifth latching circuit 421. Output data of the third latching circuit 413 may also be transferred to the seventh latching circuit 423 through the first common data transmission line CDL1. Furthermore, output data of the second latching circuit 412 may be transferred through the second common data transmission line CDL2 to the sixth latching circuit 422. Output data of the fourth latching circuit 414 may also be transferred to the eighth latching circuit 424 through the second common data transmission line CDL2.

Figure 5:
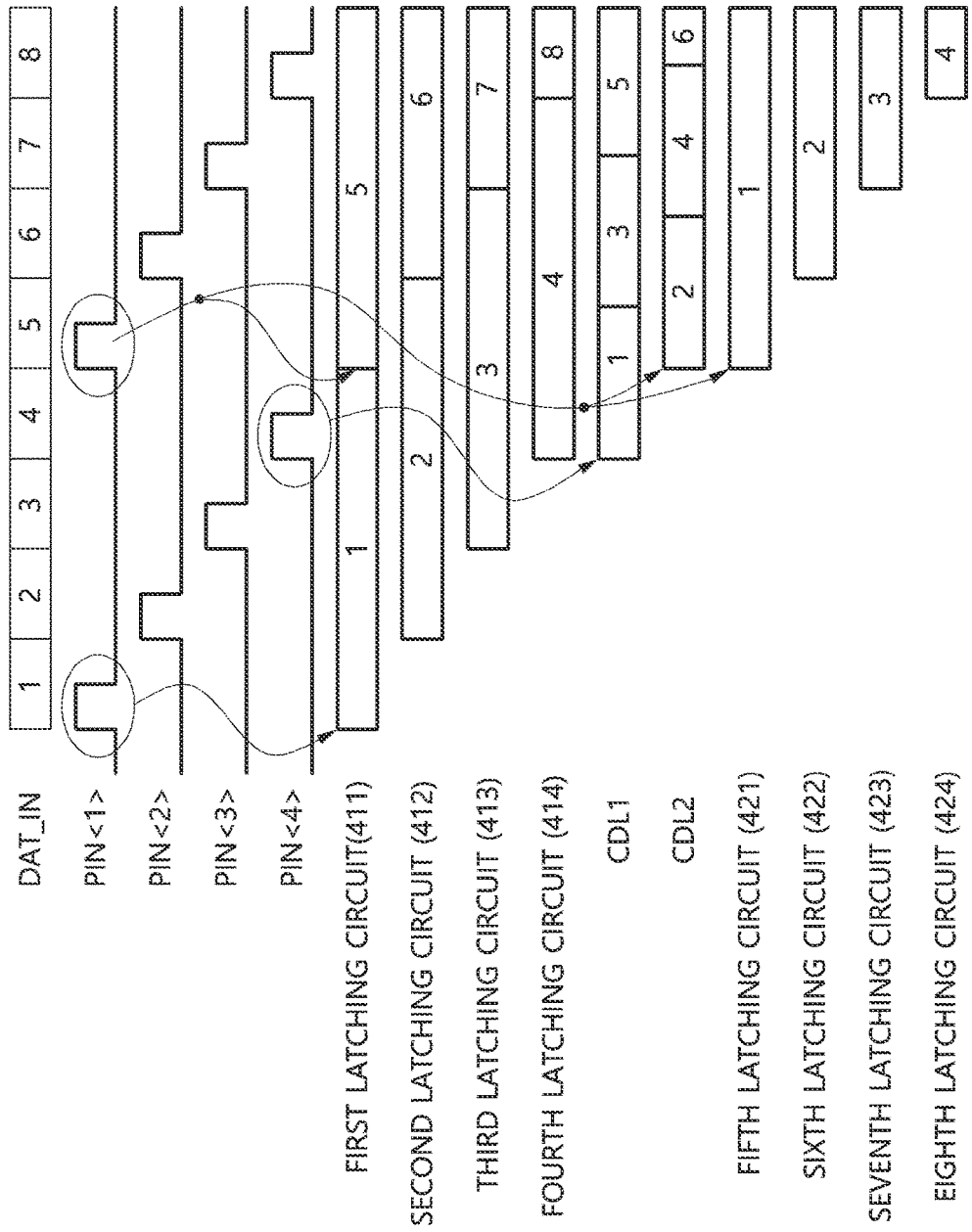
FIG. 5 is a timing diagram for describing a circuit operation of the pipe latch circuit of FIG. 4 to which first and second common data transmission lines are coupled.

FIG. 5 is a timing diagram for describing a circuit operation of the pipe latch circuit 400 of FIG. 4 to which the first and second common data transmission lines CDL1 and CDL2 are coupled. FIG. 5 illustrates input data DAT_IN, first to fourth pipe input control signals PIN<1:4>, data latched in the first to fourth latching circuits 411, 412, 413, and 414, the first and second common data transmission lines CDL1 and CDL2, and data latched in the fifth to eighth latching circuits 421, 422, 423, and 424. In this case, the input data DAT_IN may include consecutively input data "1", "2", "3", "4", "5", "6", "7", and "8."

First, when the first pipe input control signal PIN<1> is enabled according to a first pipe latching operation, the data "1", that is, the first data of the input data DAT_IN, may be latched in the first latching circuit 411. Next, when the second pipe input control signal PIN<2> is enabled, the data "2", that is, the second data, may be latched in the second latching circuit 412. When the third pipe input control signal PIN<3> is enabled, the data "3", that is, the third data, may be latched in the third latching circuit 413. When the fourth pipe input control signal PIN<4> is enabled, the data "4", that is, the fourth data, may be latched in the fourth latching circuit 414. At this time, when, based on the fourth pipe input control signal PIN<4>, the data "4" is latched in the fourth latching circuit 414, the data "1" latched in the first latching circuit 411 may be output to the first common data transmission line CDL1.

When the first pipe input control signal PIN<1> is enabled again according to a second pipe latching operation, the data "5" of the input data DAT_IN may be latched in the first latching circuit 411. At this time, the data "2" latched in the second latching circuit 412 may be output to the second common data transmission line CDL2, and the data "1" transferred through the first common data transmission line CDL1 may be latched in the fifth latching circuit 421. Next, when the second pipe input control signal PIN<2> is enabled, the data "6" may be latched in the second latching circuit 412. At this time, the data "3" latched in the third latching circuit 413 may be output to the first common data transmission line CDL1, and the data "2" transferred through the second common data transmission line CDL2 may be latched in the sixth latching circuit 422. Thereafter, when the third pipe input control signal PIN<3> is enabled, the data "7" may be latched in the third latching circuit 413. At this time, the data "4" latched in the fourth latching circuit 414 may be output to the second common data transmission line CDL2, and the data "3" transferred through the first common data transmission line CDL1 may be latched in the seventh latching circuit 423. Thereafter, when the fourth pipe input control signal PIN<4> is enabled, the data "8" may be latched in the fourth latching circuit 414. At this time, the data "5" latched in the first latching circuit 411 may be output to the first common data transmission line CDL1, and the data "4" transferred through the second common data transmission line CDL2 may be latched in the eighth latching circuit 424.

Although not illustrated, based on the first pipe output control signal POUT<1>, the data "1" latched in the fifth latching circuit 421 may be output as the output data DAT_OUT. Based on the second pipe output control signal POUT<2>, the data "2" latched in the sixth latching circuit 422 may be output as the output data DAT_OUT. Based on the third pipe output control signal POUT<3>, the data "3" latched in the seventh latching circuit 423 may be output as the output data DAT_OUT. Based on the fourth pipe output control signal POUT<4>, the data "4" latched in the eighth latching circuit 424 may be output as the output data DAT_OUT.

Next, although not illustrated, when each of the first to fourth pipe input control signals PIN<1:4> is enabled again according to a third pipe latching operation, the data "5" of the input data DAT_IN may be latched in the fifth latching circuit 421. The data "6" may be latched in the sixth latching circuit 422. The data "7" may be latched in the seventh latching circuit 423. The data "8" may be latched in the eighth latching circuit 424. Furthermore, based on the first to fourth pipe output control signals POUT<1:4>, respectively, the data "5", "6", "7", and "8" latched in the fifth to eighth latching circuits 421, 422, 423, and 424, respectively, may be output as the output data DAT_OUT.

Referring back to FIG. 4, in the pipe latch circuit 400 according to an embodiment of the present disclosure, the first latching circuit group 410 and the second latching circuit group 420 may be coupled by the first and second common data transmission lines CDL1 and CDL2. That is, the pipe latch circuit 400 may perform a normal pipe latching operation through the two first and second common data transmission lines CDL1 and CDL2.

In the pipe latch circuit 300 of FIG. 3, the first latching circuit group 310 and the second latching circuit group 320 may be coupled by the four first to fourth data transmission lines DL1, DL2, DL3, and DL4. Furthermore, in the pipe latch circuit 400 of FIG. 4, the first latching circuit group 410 and the second latching circuit group 420 may be coupled by the two first and second common data transmission lines CDL1 and CDL2. That is, the pipe latch circuit 400 of FIG. 4 may use only half the data transmission lines of the pipe latch circuit 300 of FIG. 3. To use only half the data transmission lines may mean that a circuit area and noise may be reduced that much.

Accordingly, the pipe latch circuit 400 according to an embodiment of the present disclosure may minimize an area occupied by the pipe latch circuit 400 and may minimize noise by minimizing the number of data transmission lines.

Figure 6:
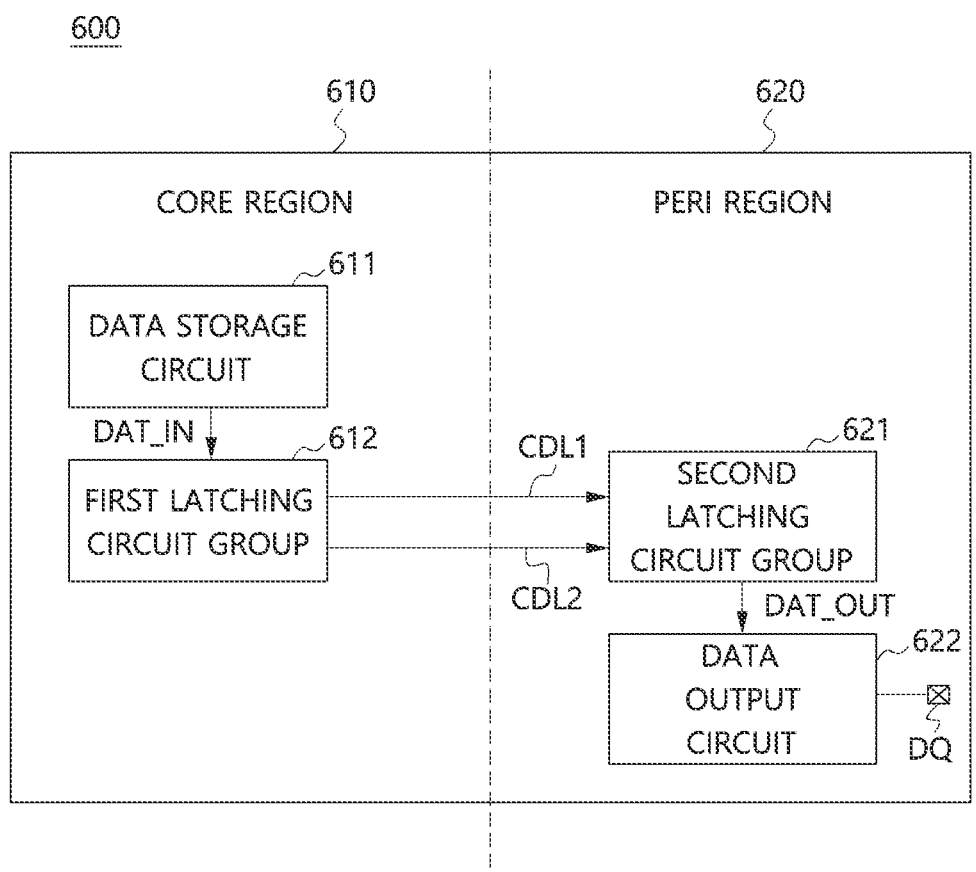
FIG. 6 is a block diagram for illustrating a configuration of a semiconductor memory device according to an embodiment of the present disclosure.

FIG. 6 is a block diagram for illustrating a configuration of a semiconductor memory device 600 according to an embodiment of the present disclosure.

Referring to FIG. 6, the semiconductor memory device 600 may be divided into a core region 610 and a peri region 620.

First, a data storage circuit 611 and a first latching circuit group 612 may be disposed in the core region 610. In this case, the data storage circuit 611 may be an element including a memory cell array for storing externally input data. Furthermore, the data storage circuit may include a data processing device for sensing and amplifying stored data and outputting the amplified data as input data DAT_IN. The first latching circuit group 612 may correspond to the first latching circuit group 410 of FIG. 4.

Next, a second latching circuit group 621 and a data output circuit 622 may be disposed in the peri region 620. In this case, the second latching circuit group 621 may correspond to the second latching circuit group 420 of FIG. 4. Furthermore, the data output circuit 622 may be an element for outputting output data DAT_OUT of the second latching circuit group 621 to an input and output pad DQ.

As described with reference to FIG. 4, the first latching circuit group 612 and the second latching circuit group 621 may be coupled by two first and second common data transmission lines CDL1 and CDL2. As described above, to use a minimum number of the first and second common data transmission lines CDL1 and CDL2 may mean that a circuit area and noise may be reduced that much.

Accordingly, the semiconductor memory device 600 according to an embodiment of the present disclosure may, by reducing the number of common data transmission lines, minimize a circuit area occupied by the semiconductor memory device 600 and minimize the noise between signals.

An embodiment of the present disclosure has an effect in that it may minimize an area occupied by the pipe latch circuit and minimize the noise incorporated into control signals by minimizing the number of control signals used in the pipe latch circuit.

An embodiment of the present disclosure has an effect in that it may minimize the area of a semiconductor memory device and minimize noise caused by data transmission lines, by minimizing the number of data transmission lines coupled between latching circuit groups included in the pipe latch circuit.

An embodiment of the present invention may include a pipe latch circuit that includes a first latching circuit group suitable for controlling a latching operation and an output operation for input data based on a plurality of pipe input control signals controlling a plurality of latching circuits; a second latching circuit group suitable for controlling a latching operation for data, output by the first latching circuit group, based on the plurality of pipe input control signals and controlling an output operation based on a plurality of pipe output control signals controlling the plurality of latching circuits; and a synchronization circuit connected in series with the first latching circuit group and the second latching circuit group and outputting input data sequentially, wherein at least one common data transmission line couples the first latching circuit group and the second latching circuit group according to a synchronization pattern.

Although various embodiments have been described for illustrative purposes, it will be apparent to those skilled in the art that various changes and modifications may be made without departing from the spirit and scope of the disclosure as defined in the following claims.

What is claimed is:

1. A pipe latch circuit comprising:
   a first latching circuit group suitable for controlling a latching operation and an output operation for input data according to only a plurality of pipe input control signals; and
   a second latching circuit group suitable for controlling a latching operation for data, output by the first latching circuit group, based on the plurality of pipe input control signals and controlling an output operation based on a plurality of pipe output control signals.

2. The pipe latch circuit of claim 1, wherein the first latching circuit group comprises:
   a first latching circuit suitable for latching the input data based on a first pipe input control signal included in the plurality of pipe input control signals and outputting latched data based on a second pipe input control signal included in the plurality of pipe input control signals; and
   a second latching circuit suitable for latching the input data based on the second pipe input control signal and outputting latched data based on the first pipe input control signal.

3. The pipe latch circuit of claim 2, wherein the second latching circuit group comprises:
   a third latching circuit suitable for latching the output data of the first latching circuit based on the first pipe input control signal and outputting latched data as output data based on a first pipe output control signal included in the plurality of pipe output control signals; and
   a fourth latching circuit suitable for latching the output data of the second latching circuit based on the second pipe input control signal and outputting latched data as the output data based on a second pipe output control signal included in the plurality of pipe output control signals.

4. The pipe latch circuit of claim 1, further comprising a control signal generation circuit suitable for generating the plurality of pipe input control signals and the plurality of pipe output control signals upon read operation.

5. The pipe latch circuit of claim 1, wherein a number of the plurality of pipe input control signals corresponds to the number of latching circuits included in the first latching circuit group.

6. The pipe latch circuit of claim 1, wherein the number of the plurality of pipe output control signals corresponds to the number of latching circuits included in the second latching circuit group.

7. The pipe latch circuit of claim 1, wherein:
   each of the first and second latching circuit groups comprises at least three latching circuits, and
   the first latching circuit group and the second latching circuit group are coupled by at least one common data transmission line.

8. An operating method of a pipe latch circuit, comprising:
   performing, in a first pipe latching operation, a first latching operation and a first output operation on input data according to only a plurality of pipe input control signals;
   performing, in a second pipe latching operation, a second latching operation on data, output in the first pipe latching operation step, based on the plurality of pipe input control signals and performing a second output operation on latched data based on a plurality of pipe output control signals; and performing a third pipe latching operation by repeating the first pipe latching operation step and the second pipe latching operation step.

9. The operating method of claim 8, further comprising generating the plurality of pipe input control signals and the plurality of pipe output control signals upon read operation.

10. The operating method of claim 8, wherein the first pipe latching operation step comprises:

latching, in a first latching step, the input data in a first latching circuit based on a first pipe input control signal included in the plurality of pipe input control signals;

latching, in a second latching step, the input data in a second latching circuit based on a second pipe input control signal included in the plurality of pipe input control signals;

outputting, in a first output step, the data latched in the first latching circuit based on the second pipe input control signal; and outputting, in a second output step, the data latched in the second latching circuit based on the first pipe input control signal.

11. The operating method of claim 10, wherein the second pipe latching operation step comprises:

latching, in a third latching step, output data of the first latching circuit in a third latching circuit based on the first pipe input control signal;

latching, in a fourth latching step, output data of the second latching circuit in a fourth latching circuit based on the second pipe input control signal; and outputting, sequentially in a third output step, the data latched in the third and fourth latching circuits based on the plurality of pipe output control signals.

12. The operating method of claim 11, comprising:

performing the first and third latching steps and the second output step simultaneously based on the first pipe input control signal; and performing the second and fourth latching steps and the first output step simultaneously based on the second pipe input control signal.

13. The operating method of claim 8, comprising:

performing the first pipe latching operation, the second pipe latching operation and the third pipe latching operation by latching using a plurality of unit latching circuit groups each comprising a plurality of latching circuits that are coupled in series;

performing the second pipe latching operation step by using a last unit latching circuit group from which output data is generated; and performing the first pipe latching operation step by using at least one unit latching circuit group coupled to a previous stage of the last unit latching circuit group.

* * * * *